(12) United States Patent
Wang et al.

(10) Patent No.: US 12,015,133 B2
(45) Date of Patent: Jun. 18, 2024

(54) FLEXIBLE DISPLAY DEVICE

(71) Applicant: BOE TECHNOLOGY GROUP CO., LTD., Beijing (CN)

(72) Inventors: Haoran Wang, Beijing (CN); Xiaolin Liu, Beijing (CN); Hong Zhu, Beijing (CN); Xiongnan Zhang, Beijing (CN); Ziyu Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 422 days.

(21) Appl. No.: 17/435,124

(22) PCT Filed: Apr. 9, 2021

(86) PCT No.: PCT/CN2021/086289
§ 371 (c)(1),
(2) Date: Aug. 31, 2021

(87) PCT Pub. No.: WO2021/238450
PCT Pub. Date: Dec. 2, 2021

(65) Prior Publication Data
US 2022/0166082 A1    May 26, 2022

(30) Foreign Application Priority Data

May 25, 2020   (CN) .......................... 202010450415.4
Nov. 13, 2020  (CN) .......................... 202011267683.9

(51) Int. Cl.
*H01M 10/623* (2014.01)
*H01L 51/00* (2006.01)
(Continued)

(52) U.S. Cl.
CPC ....... *H01M 10/623* (2015.04); *H01M 10/613* (2015.04); *H01M 10/6551* (2015.04);
(Continued)

(58) Field of Classification Search
CPC ............ H01M 10/623; H01M 10/613; H01M 10/6551; H01M 10/658; H01M 2220/30;
(Continued)

(56) References Cited

U.S. PATENT DOCUMENTS 6,324,055 B1 * 11/2001 Kawabe ................ G06F 1/1616
361/705
7,423,878 B2 * 9/2008 Kim .................... H05K 7/20963
345/905

(Continued)

FOREIGN PATENT DOCUMENTS

| CN | 106229556 A | 12/2016 |
| CN | 107845740 A | 3/2018 |

(Continued)

OTHER PUBLICATIONS

Extended European Search Report for EP Patent Application No. 21810268.9 mailed Sep. 13, 2022.

(Continued)

*Primary Examiner* — Anatoly Vortman
(74) *Attorney, Agent, or Firm* — Perilla Knox & Hildebrandt LLP; Kenneth A. Knox (57) ABSTRACT

A flexible display device is described, including: a flexible display panel; a flexible battery arranged at a side of the flexible display panel away from a light emitting surface; and a heat dissipation assembly including a first heat dissipation sheet, the first heat dissipation sheet being arranged at a side of the flexible battery facing or away from the flexible display panel, and the first heat dissipation sheet having a bendable area.

17 Claims, 8 Drawing Sheets

(51) Int. Cl.
*H01L 51/52* (2006.01)
*H01M 10/613* (2014.01)
*H01M 10/6551* (2014.01)
*H01M 10/658* (2014.01)
*H10K 50/87* (2023.01)
*H10K 77/10* (2023.01)
*H10K 102/00* (2023.01)

(52) U.S. Cl.
CPC .......... *H01M 10/658* (2015.04); *H10K 50/87* (2023.02); *H10K 77/111* (2023.02); *H01M 2220/30* (2013.01); *H10K 2102/311* (2023.02)

(58) Field of Classification Search
CPC . H10K 77/111; H10K 50/87; H10K 2102/311
USPC .......................................................... 361/704
See application file for complete search history.

(56) References Cited

U.S. PATENT DOCUMENTS

| | | | |
|---|---|---|---|
| 8,320,119 B2* | 11/2012 | Isoshima | H05K 7/20972 |
| | | | 165/104.34 |
| 8,811,032 B2* | 8/2014 | Ladouceur | H04M 1/0268 |
| | | | 361/679.13 |
| 9,354,733 B2* | 5/2016 | Kim | G06F 1/26 |
| 9,882,179 B2 | 1/2018 | Tajima | |
| 10,355,228 B2 | 7/2019 | Yu | |
| 10,503,210 B2 | 12/2019 | Lee et al. | |
| 10,517,196 B2* | 12/2019 | Chen | H10K 50/87 |
| 11,272,639 B2* | 3/2022 | Yang | G06F 1/203 |
| 11,327,533 B2* | 5/2022 | Wang | G06F 1/203 |
| 2002/0118333 A1* | 8/2002 | Koiwa | G02F 1/133382 |
| | | | 349/161 |
| 2006/0022910 A1* | 2/2006 | Sekiya | G06F 1/1656 |
| | | | 345/76 |
| 2014/0267949 A1 | 9/2014 | Kim et al. | |
| 2016/0066440 A1* | 3/2016 | Choi | G06F 1/1601 |
| | | | 361/679.3 |
| 2017/0033327 A1 | 2/2017 | Tajima | |
| 2017/0139442 A1 | 5/2017 | Yoshizumi | |
| 2017/0329368 A1 | 11/2017 | Rho et al. | |
| 2018/0074553 A1 | 3/2018 | Yamazaki | |
| 2018/0150107 A1 | 5/2018 | Lee et al. | |
| 2019/0075688 A1* | 3/2019 | Chen | H10K 50/87 |
| 2019/0123289 A1 | 4/2019 | Yu | |
| 2019/0132987 A1 | 5/2019 | Koo et al. | |
| 2020/0245501 A1* | 7/2020 | Wu | G06F 1/203 |
| 2021/0153363 A1 | 5/2021 | Cao et al. | |
| 2022/0114922 A1* | 4/2022 | Cui | H01M 50/51 |
| 2023/0301043 A1* | 9/2023 | Ko | G06F 1/1652 |
| | | | 361/704 |

FOREIGN PATENT DOCUMENTS

| | | |
|---|---|---|
| CN | 108122492 A | 6/2018 |
| CN | 109727532 A | 5/2019 |
| CN | 110706593 A | 1/2020 |
| CN | 110767096 A | 2/2020 |
| CN | 110796955 A | 2/2020 |
| CN | 111564677 A | 8/2020 |
| EP | 3705984 A1 | 9/2020 |

OTHER PUBLICATIONS

International Search Report and Written Opinion for International Application No. PCT/CN2021/086289 mailed Jun. 30, 2021.

* cited by examiner

FLEXIBLE DISPLAY DEVICE

CROSS REFERENCE TO RELATED APPLICATIONS

The present disclosure is a national phase application under 35 U.S.C. § 371 of International Application No. PCT/CN2021/086289 filed on Apr. 9, 2021, which claims the benefit of and priority to Chinese Patent Application No. 202010450415.4 filed on May 25, 2020 and Chinese Patent Application No. 202011267683.9 filed on Nov. 13, 2020, entitled "FLEXIBLE DISPLAY DEVICE," the contents of all of which being incorporated by reference in their entireties herein.

TECHNICAL FIELD

The present disclosure relates to the field of display technology and, in particular, to a flexible display device.

BACKGROUND

The emergence of flexible display panels has greatly broadened the form design of electronic devices. The research on thinner and flexibility of energy storage devices provides feasibility for matching the flexible display panel and the flexible energy storage device. However, the realization of the overall flexibility of the display device has many limitations.

In addition, the energy storage device will generate a certain amount of heat when working (charging and discharging). If the energy storage device has a local position abnormality, it will also have a problem of local high heat concentration, i.e., "hot spot", which has a very serious functional impact on the flexible battery and the flexible display panel. In a severe case, it will damage the panel and even cause a serious safety risk to a user.

It should be noted that the information of the present disclosure in the above background section is only used for enhancing the understanding of the background of the present disclosure, and therefore may include information that does not constitute the prior art known to those skilled in the art.

SUMMARY

An aspect of the present disclosure provides a flexible display device, including:
 a flexible display panel;
 a flexible battery arranged at a side of the flexible display panel away from a light emitting surface;
 a heat dissipation assembly including a first heat dissipation sheet, the first heat dissipation sheet being arranged at a side of the flexible battery facing or away from the flexible display panel, and the first heat dissipation sheet having a bendable area.

In an exemplary embodiment of the present disclosure, the bendable area of the first heat dissipation sheet has a through structure in a thickness direction.

In an exemplary embodiment of the present disclosure, the first heat dissipation sheet has a one-piece structure, the first heat dissipation sheet includes a plurality of patterned opening holes in the bendable area, and the opening hole forms the through structure.

In an exemplary embodiment of the present disclosure, the first heat dissipation sheet includes a plurality of heat dissipation bars arranged in parallel in the bendable area, any two adjacent heat dissipation bars have an interval therebetween, and the interval forms the through structure.

In an exemplary embodiment of the present disclosure, the first heat dissipation sheet further includes a plurality of connection members, and the connection member connects two adjacent heat dissipation bars, and
 the connection member is pivotally connected to the two adjacent heat dissipation bars, so that the two adjacent heat dissipation bars are rotatable relative to the connection member.

In an exemplary embodiment of the present disclosure, at least one first protruding portion is provided on at least one long side of the heat dissipation bar to face an adjacent heat dissipation bar.

In an exemplary embodiment of the present disclosure, a second protruding portion is provided on the long side of the heat dissipation bar at a position corresponding to the first protruding portion of the adjacent heat dissipation bar, and the second protruding portion has a notch that matches a shape of the first protruding portion, so that the notch and the first protruding portion can be fit to each other.

In an exemplary embodiment of the present disclosure, the first heat dissipation sheet further includes a heat dissipation pipe, and the heat dissipation pipe is connected to each of the heat dissipation bars.

In an exemplary embodiment of the present disclosure, the first heat dissipation sheet further includes a base layer, the heat dissipation bars are adhered to one side of the base layer, and another side of the base layer is adhered to the flexible battery or the flexible display panel.

In an exemplary embodiment of the present disclosure, a width L of the heat dissipation bar satisfies $0.05 \text{ mm} \leq L \leq 20 \text{ mm}$, and a width h of the interval between two adjacent heat dissipation bars satisfies $0.1 \text{ mm} \leq h \leq 510 \text{ mm}$.

In an exemplary embodiment of the present disclosure, a through hole is formed in the heat dissipation bar.

In an exemplary embodiment of the present disclosure, a material of the first heat dissipation sheet is metal.

In an exemplary embodiment of the present disclosure, the heat dissipation assembly further includes:
 a second heat dissipation sheet arranged on another side of the flexible battery facing or away from the flexible display panel, the second heat dissipation sheet having a bendable area, and the bending area of the second heat dissipation sheet corresponding to the bendable area of the heat insulation layer and the bendable area of the first heat dissipation sheet.

In an exemplary embodiment of the present disclosure, a structure of the second heat dissipation sheet is same as or different from that of the first heat dissipation sheet, and a material of the second heat dissipation sheet is same as or different from that of the first heat dissipation sheet.

In an exemplary embodiment of the present disclosure, the heat dissipation assembly further includes:
 a heat insulation layer arranged between the heat dissipation sheet close to the flexible display panel and the flexible display panel, and having a bendable area corresponding to the bendable area of the first heat dissipation sheet.

In an exemplary embodiment of the present disclosure, the heat insulation layer includes a material of rubber, silica gel, porous material, polyurethane, acrylic, or an organic film layer containing a metal coating.

In an exemplary embodiment of the present disclosure, thicknesses of the first heat dissipation sheet, the heat insulation layer and the second heat dissipation sheet are not larger than 1 mm.

In an exemplary embodiment of the present disclosure, the heat dissipation assembly further includes:

a heat conduction member arranged between the first heat dissipation sheet and the second heat dissipation sheet and connecting the first heat dissipation sheet and the second heat dissipation sheet, the heat conduction member being located on at least one side of the flexible battery and there being an interval between the heat conduction member and the flexible battery.

In an exemplary embodiment of the present disclosure, the flexible display device further includes:

a heat dissipation unit connected to at least one of the first heat dissipation sheet, the second heat dissipation sheet or the heat conduction member.

In an exemplary embodiment of the present disclosure, the flexible battery includes a flexible housing and a positive electrode, a negative electrode, an electrolyte, an insulation layer, a positive current collector, and a negative current collector arranged in the flexible housing, the positive electrode and the negative electrode are arranged opposite to each other, the insulation layer is arranged between the positive electrode and the negative electrode, the positive current collector is arranged on a side of the positive electrode away from the insulation layer, the negative current collector is arranged on a side of the negative electrode away from the insulation layer, and the electrolyte is distributed between the positive electrode and the negative electrode.

It should be understood that the above general description and the following detailed description are only exemplary and explanatory, and cannot limit the present disclosure.

BRIEF DESCRIPTION OF THE DRAWINGS

The drawings herein are incorporated into the specification and constitute a part of the specification, show embodiments that conform to the present disclosure, and together with the specification, serve to explain the principle of the present disclosure. Obviously, the drawings in the following description are only some embodiments of the present disclosure, and other drawings can be obtained by those skilled in the art from these drawings without creative work.

FIGS. 9(a) to 9(h) show various structures of a heat dissipation bar including a first protruding portion.

FIGS. 11(a) to 11(c) show various structures of a heat dissipation bar including a first protruding portion and a second protruding portion.

DETAILED DESCRIPTION

Example embodiments will now be described more fully with reference to the accompanying drawings. However, the example embodiments may be implemented in various forms, and should not be construed as being limited to the embodiments set forth herein; on the contrary, these embodiments are provided so that the present disclosure will be comprehensive and complete, and fully convey the concept of the example embodiments to those skilled in the art. The same reference numerals in the figures indicate the same or similar structures, and thus their detailed descriptions will be omitted.

An embodiment of the present disclosure provides a flexible display device, including a flexible display panel, a flexible battery, and a heat dissipation assembly. The flexible display panel is arranged at a side of the flexible display panel away from a light emitting surface, the heat dissipation assembly includes a first heat dissipation sheet, and the first heat dissipation sheet faces towards or faces away from any side of the flexible display panel, and has a bendable area.

The display panel, battery, and first heat dissipation sheet of the present disclosure all have a flexible structure, and each can be bent or folded, realizing the flexibility of the whole structure. At the same time, because the battery generates considerable amounts of heat during charging and discharging, and heating parts of the battery are uneven, the first heat dissipation sheet being arranged on either side of the flexible battery can absorb the heat generated by the flexible battery, reduce a battery temperature, and make the battery temperature uniform to avoid adverse effects on the display panel.

Figure 1:
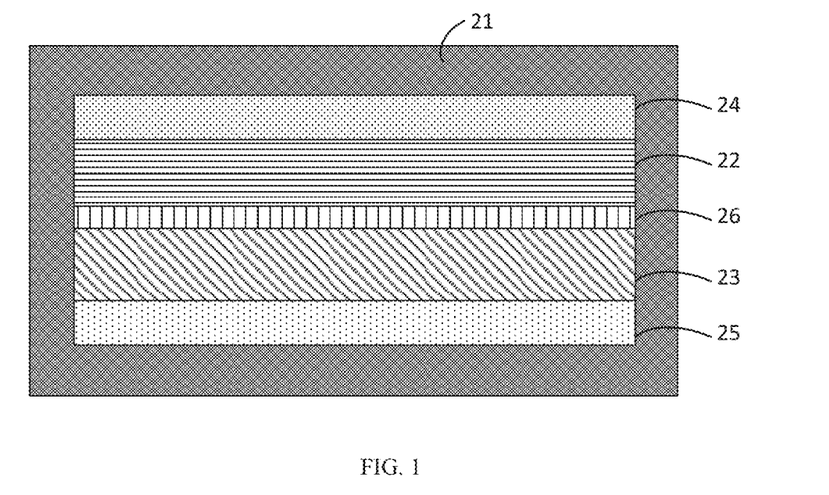
FIG. 1 is a schematic diagram of a structure of a flexible battery in an embodiment.

The flexible display device of the embodiment will be described below:

As shown in FIG. 1, a basic structure of the flexible battery of the embodiment of the present disclosure includes a flexible housing 21, and a positive electrode 22, a negative electrode 23, an electrolyte, a positive current collector 24, a negative current collector 25, and a separator 26 are arranged in flexible housing 21. The positive electrode 22 and negative electrode 23 are arranged opposite to each other, and the separator 26 is arranged between the positive electrode 22 and the negative electrode 23 to isolate the positive electrode 22 and the negative electrode 23 to avoid direct contact between active materials on the two electrodes to cause short circuit inside the battery 2. The positive current collector 24 is in contact with the positive electrode 22 and is used to transmit current of the positive electrode 22 to an external circuit. The negative current collector 25 is in contact with the negative electrode 23 and is used to transmit current of the external circuit to the negative electrode 23. The electrolyte is injected between the positive electrode 22 and the negative electrode 23 as carrier of ion movement. Although the electrolyte is not shown in the figure, those skilled in the art know that the electrolyte should be distributed between the positive electrode 22 and the negative electrode 23 in order to transfer ions.

For example, the flexible battery 2 is a lithium battery, and the charging process of the flexible battery 2 is that: lithium ions generated by the positive electrode 22 enter the electrolyte from the positive electrode 22, then, they enter the electrolyte through micropores on the separator 26, and finally move to the negative electrode 23, and are combined with electrons of the negative electrode 23. The discharging process of the flexible battery 2 is that: the electrons move from the negative electrode 23 to the positive electrode 22 through the external circuit, lithium ions enter the electrolyte from the negative electrode 23, then they enter the electrolyte through the micropores on the separator 26, and finally move to the positive electrode 22, and are combined with the electrons of the positive electrode 22.

In order to achieve flexibility, each of the above parts needs to be flexible. The positive electrode 22 may be flexible by arranging patterned opening holes 10 on a sheet of the solid positive electrode 22, and the opening holes 10 are used to buffer strain generated during bending and twisting. The material of the positive electrode 22 differs according to the type of the flexible battery 2, for example, lithium cobalt oxide, lithium manganate, lithium iron phosphate, and the like used in the lithium battery 2. The material of the negative electrode 23 may be graphite powder or graphene, which achieves flexibility, and the flexibility may also be achieved by providing patterned opening holes 10 on a sheet of the negative electrode 23. The separator 26 may be a polymer film, and may have a single-layer structure or a multilayer structure. When the separator 26 has the single-layer structure, conventional polymer film materials such as polyethylene, polypropylene may be used. When the separator 26 has the multilayer structure, a composite double-layer structure such as polypropylene/polyethylene or a composite three-layer structure such as polypropylene/polyethylene/polypropylene may be used. Such materials have flexibility and may be made flexible. The positive current collector 24 and the negative current collector 25 may use conventional metal current collector materials, such as copper, aluminum, stainless steel, or use high-conductivity materials, such as graphene-based conductive films. The flexible battery 2 assembled by such film may realize conductive and flexible functions. Metal current collectors with patterned opening holes 10 (such as copper mesh, aluminum mesh, etc.) may also be used. The flexible housing 21 may be made of materials such as aluminum plastic film or copper plastic film provided with conventional or patterned opening holes 10, and may also be made of a flexible polymer material. Most of the electrolyte is liquid or gel-like, which is inherently flexible, and solid electrolyte may also be used.

It should be noted that the opening holes 10 provided for the internal parts of the flexible battery for bending and folding should be arranged correspondingly.

Figure 2:
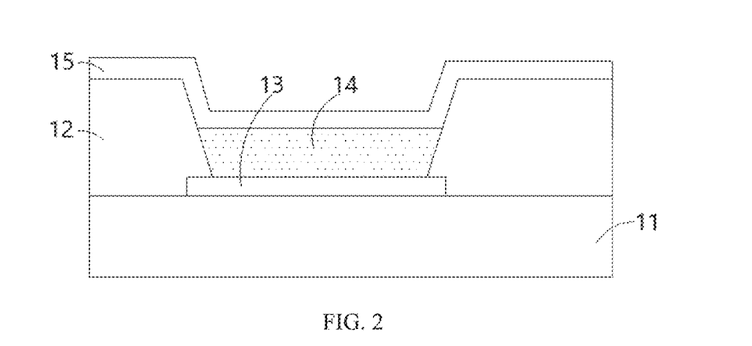
FIG. 2 is a schematic diagram of a structure of a flexible display panel in an embodiment.

A basic structure of the flexible display panel in the embodiment is shown in FIG. 2. The display panel includes a substrate 11 on which a driving transistor and a driving circuit (not shown in the figure) are provided. In order to achieve flexibility, the substrate 11 needs to use a flexible material, and the flexible material may be a polymer material, such as polyethylene (PE), polypropylene (PP), polyimide (PI), polyethylene terephthalate (PET), polyethylene naphthalate (PEN). The flexible substrate 11 is also provided with a patterned opening hole 10 to relieve the stress of curling and bending. One side of the substrate 11 is provided with a pixel defining layer 12 for defining an opening area of each sub-pixel, and each opening area is provided with a light-emitting device. The light-emitting device may be an organic electroluminescent device, which specifically includes an anode layer 13, an organic luminescent material layer 14 and a cathode layer 15, and may further include a hole transport layer, an electron transport layer, an electron injection layer, a hole injection layer and other film layers, which is not specifically limited by the present disclosure. Further, the display panel 1 may also include an encapsulation layer, and the encapsulation layer may use a manner of film encapsulation to achieve flexibility.

Figure 3:
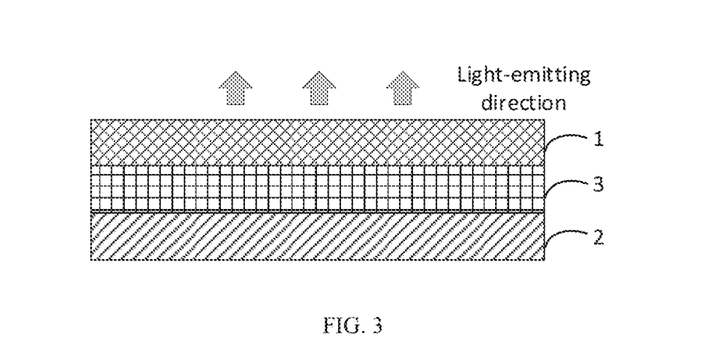
FIG. 3 is a schematic diagram of a structure of a heat dissipation assembly in a first embodiment.

FIG. 3 is a schematic diagram of a cross-sectional structure of a heat dissipation assembly in an embodiment. A first heat dissipation sheet 3 is arranged between the flexible display panel 1 and the flexible battery 2, and the first heat dissipation sheet 3 is disposed on one side of the battery 2 for absorbing heat dissipated by the side of the flexible battery 2 toward the display panel 1 to reduce the temperature of the battery 2 and prevent local temperature of the battery 2 from being too high, so as to avoid affecting the display panel 1. The first heat dissipation sheet 3 has a bendable area, so as to cooperate with the whole device to achieve curling or bending.

The material of the first heat dissipation sheet 3 may also be an organic material with high thermal conductivity such as graphene. When the graphene is selected for the first heat dissipation sheet 3, since the graphene has high flexibility and can be curled or bent, the first heat dissipation sheet 3 may have a one-piece structure, and as a whole, can be regarded as a bendable area. Moreover, a thin graphene heat dissipation sheet may achieve good thermal conductivity, and thus the overall thickness of the display device can be controlled within an ideal range. The first heat dissipation sheet 3 made of graphene material may be fixed to the display panel 1 and the battery 2 by adhering.

The material of the first heat dissipation sheet 3 may also be a metal material, such as silver, copper, aluminum, gold, iron, tin, or an alloy material of the above metals. The above metal materials may not only have a heat dissipation function, but also have a good supporting function for the flexible display panel, thereby improving anti-extrusion ability of the flexible display panel. Due to strong rigidity of metal material, in order to achieve ideal bending performance, a through structure in a thickness direction may be formed in the bendable area of the material to release the stress during bending of the material and improve the bending performance. At the same time, it may also meet the lightweight design. The through structure may have various forms.

Figure 4:
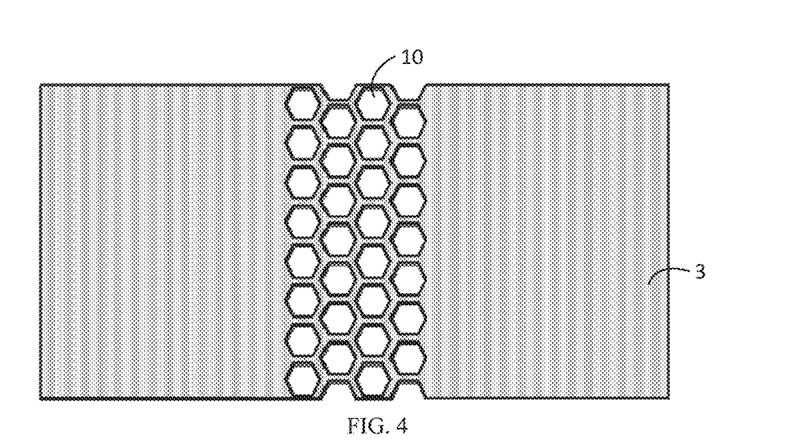
FIG. 4 is a schematic diagram of a first type of patterned opening holes when a first heat dissipation sheet has a one-piece structure.
Figure 5:
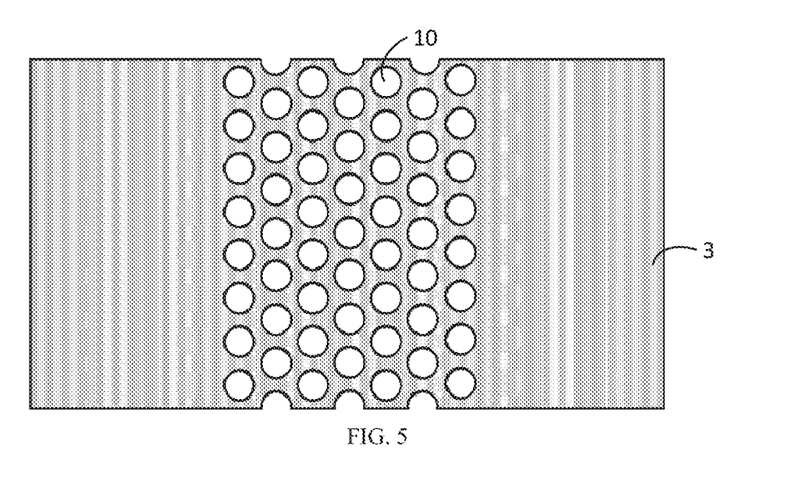
FIG. 5 is a schematic diagram of a second type of patterned opening holes when a first heat dissipation sheet has a one-piece structure.
Figure 6:
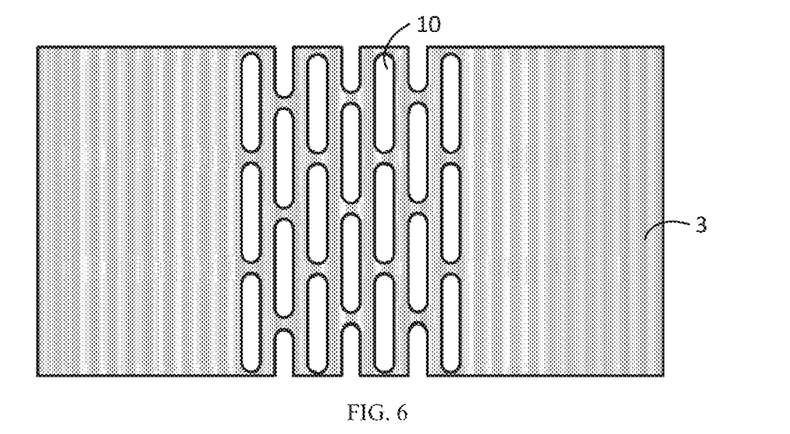
FIG. 6 is a schematic diagram of a third type of patterned opening holes when a first heat dissipation sheet has a one-piece structure.

In some embodiments, the first heat dissipation sheet 3 is a one-piece structure, and the bendable area of the first heat dissipation sheet 3 is provided with patterned opening holes 10. i.e., the opening holes 10 of the through structure on the first heat dissipation sheet 3 are formed, which may buffer the stress received when the heat dissipation sheet is bent. It can be understood that the bendable area of the first heat dissipation sheet 3 may correspond to the bendable area of the flexible display panel 1 or the flexible battery 2. The patterned opening holes 10 may be as shown as in FIGS. 4 to 6. In a first structure shown in FIG. 4, the patterned opening holes 10 are hexagons arranged in an array. In a second structure shown in FIG. 5, the patterned opening holes 10 are circles arranged in an array. In a third structure shown in FIG. 6, the patterned opening holes 10 are rectangles with semicircular ends arranged in an array. Among the three structures, the third structure is the preferred structure, and the opening form thereof has a better stress dispersion effect and better bendability. The first heat dissipation sheet 3 made of a one-piece metal material may be fixed to the display panel 1 and the battery 2 by mechanical connection, such as clamping, riveting, or it may be adhered to the display panel 1 and the battery 2 by means of adhesive tape, glue.

Figure 7:
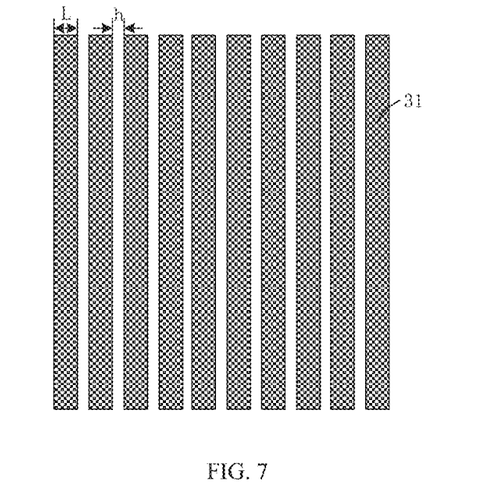
FIG. 7 is a schematic diagram of a structure of a first heat dissipation sheet including heat dissipation bars.

In some other embodiments, the first heat dissipation sheet 3 may not be a one-piece structure. For example, as shown in FIG. 7, the first heat dissipation sheet 3 includes a plurality of heat dissipation bars 31 arranged in parallel, and there is an interval between any two adjacent heat dissipation bars 31, and the interval forms the through structure in the first heat dissipation sheet 3. The adjacent heat dissipation bars 31 may be folded relative to each other due to the interval, so that the entire first heat dissipation sheet 3 is bendable as a whole. Compared with the structure with opening holes in the one-piece metal sheet, the first heat dissipation sheet 3 of this structure has a better bending effect, and may further reduce the stress influence of metal parts on the flexible display module, and the display panel has higher flexibility and reliability. In addition, the overall resilience of the first heat dissipation sheet 3 may be further reduced, and the difficulty of assembling the complete flexible device and the difficulty of implementing flexible action may be reduced. In this structure, the heat dissipation bar 31 and the interval thereof are at least arranged in the bendable area of the first heat dissipation sheet 3. Of course, the structure of the heat dissipation bar may also be provided in the non-bend area to dissipate the heat of the flexible battery or to support the display panel. It can be understood that the arrangement direction of the heat dissipation bars 31 (that is, the arrangement direction of the intervals) may be consistent with the bending direction to achieve bending. It should be noted that the parallel arrangement of the multiple heat dissipation bars described in the present disclosure allows the angle error of the actual product due to process accuracy and other reasons.

Figure 8:
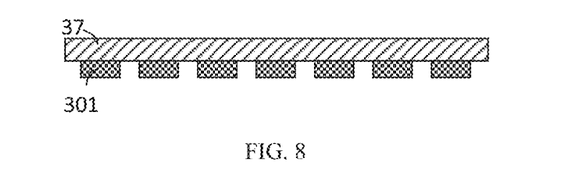
FIG. 8 is a schematic view of an adhering structure of heat dissipation bars.

Referring to FIG. 8, the heat dissipation bar 31 may be adhered to a base layer 37, and then the base layer 37 is adhered to the flexible display panel or the flexible battery. Of course, the base layer 37 may also be fixed on the flexible battery or flexible display panel by mechanical connection, such as clamping, riveting. When the heat dissipation bar 31 is adhered onto the base layer, the heat dissipation bar 31 may be displaced in the bending direction (i.e., the width direction) during a plurality of bending processes, resulting in uniform heat conduction and reduced supporting capacity of the first heat dissipation sheet.

Figure 9:
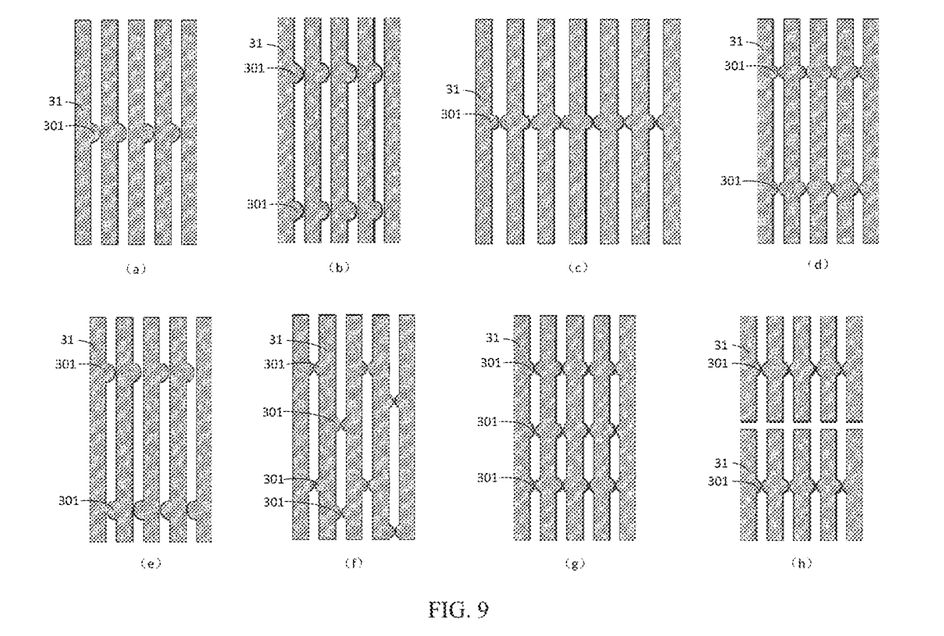

In some exemplary embodiments, referring to FIG. 9, at least one first protruding portion 301 is provided on at least one long side of the heat dissipation bar 31 to face an adjacent heat dissipation bar 31. When the heat dissipation bar 31 itself or the adjacent heat dissipation bar 31 thereto is displaced, the first protruding portion 301 may abut on the adjacent heat dissipation bar 31 to limit the position of the heat dissipation bar 31 itself or the adjacent heat dissipation bar 31 thereto, so that a fixed interval is always maintained between the two adjacent heat dissipation bars 31 to avoid reduction in the heat conduction uniformity and the supporting capacity due to a large displacement. The first protruding portion 301 may be provided on only one long side of the heat dissipation bar 31 or may be provided on two long sides of the heat dissipation bar 31. Each heat dissipation bar 31 may be provided with one or more first protruding portions 301. The positions of the first protruding portions 301 on two adjacent heat dissipation bars 31 may or may not correspond to each other.

For example, as shown in FIG. 9 (*a*), a plurality of heat dissipation bars 31 are arranged to be spaced apart from each other horizontally, and the right side of each heat dissipation bar 31 is provided with one first protruding portion 301 protruding to the right, and respective first protruding portions 301 are located on the same horizontal line. As shown in FIG. 9 (*b*), the right side of each heat dissipation bar 31 is provided with two first protruding portions 301 which are at upper and lower positions respectively and protrude to the right, the respective upper first protruding portions 301 are located on the same horizontal line, and the lower first protruding portions 301 are located on the same horizontal line. As shown in FIG. 9 (*c*), the left side of each heat dissipation bar 31 is provided with one first protruding portion 301 protruding to the left, and the right side of each heat dissipation bar 31 is provided with one first protruding portion 301 protruding to the right, and the respective first protruding portions 301 are located on the same horizontal line. Therefore, the first protruding portions 301 of two adjacent heat dissipation bars 31 are arranged oppositely. As shown in FIG. 9 (*d*), each of the left and right sides of each heat dissipation bar 31 is provided with two first protruding portions 301 which are at upper and lower positions respectively, the respective upper first protruding portions 301 are located on the same horizontal line, and the respective lower first protruding portions 301 are located on the same horizontal line. As shown in FIG. 9 (*e*), the left side of each heat dissipation bar 31 is provided with one first protruding portion 301 protruding to the left, the right side of each heat dissipation bar 31 is provided with one first protruding portion 301 protruding to the right, the respective first protruding portions 301 protruding to the left are arranged on one horizontal line, and the respective first protruding portions 301 protruding to the right are arranged on another horizontal line. Therefore, the first protruding portions 301 of two adjacent heat dissipation bars 31 are staggered up and down. As shown in FIG. 9 (*f*), each of the left and right sides of each heat dissipation bar 31 is provided with two first protruding portions 301 which are at upper and lower positions respectively, and each heat dissipation bar 31 has four first protruding portions 301 that are staggered left and right. As shown in FIG. 9 (*g*), each of the left and right sides of each heat dissipation bar 31 is provided with three first protruding portions 301 which are at upper, middle, and lower positions, respectively, and the first protruding portions 301 of each heat dissipation bar 31 are arranged at three horizontal lines respectively. As shown in FIG. 9 (*h*), a plurality of heat dissipation bars 31 may be arranged in a plurality of groups in the longitudinal direction in the figure.

Figure 10:
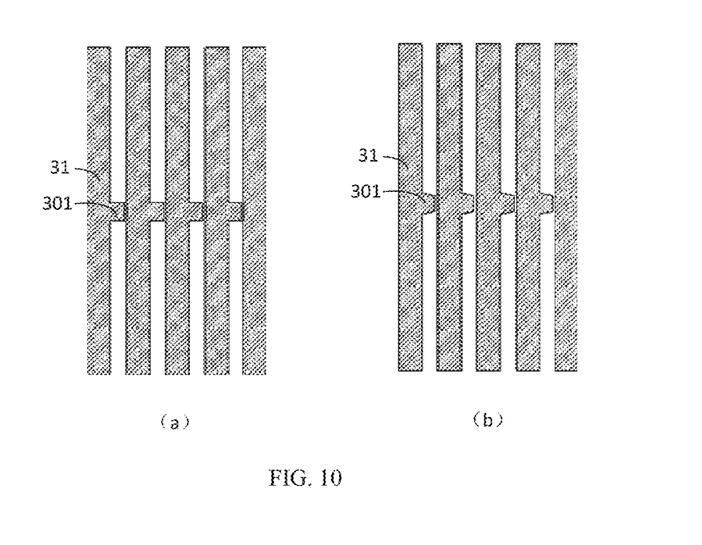
FIGS. 10(a) and 10(b) show various shapes of a first protruding portion.

The shapes of the first protruding portions 301 in the above specific embodiments are all semicircular as an example. It can be understood that the shape of the first protruding portion 301 may also be of any other shape, such as rectangle shown in FIG. 10 (*a*), trapezoid shown in FIG. 10 (*b*).

Figure 11:
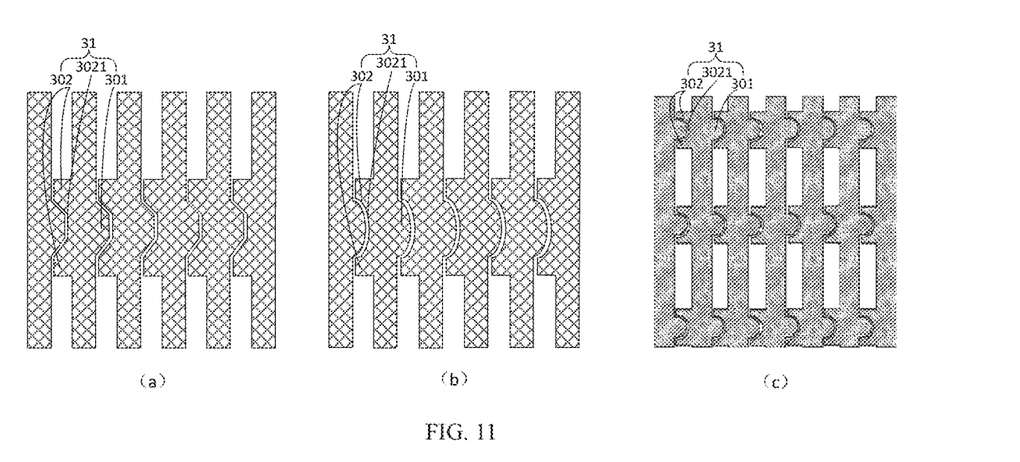

Further, in some exemplary embodiments, referring to FIG. 11, the long side of the heat dissipation bar 31 is further provided with a second protruding portion 302 at a position corresponding to the first protruding portion 301 of the adjacent heat dissipation bar 31. The second protruding portion 302 is provided with a notch 3021, and the notch 3021 matches the shape of the first protruding portion 301, so that when the two heat dissipation bars 31 are displaced, the notch 3021 and the first protruding portion 301 may be engaged to prevent the heat dissipation bars 31 from moving further. Moreover, the notch 3021 may enclose the first protruding portion 301, which may also prevent the heat dissipation bar 31 from moving in the longitudinal direction in the figure, that is, may limit the position of the heat dissipation bar 31 in both the horizontal and vertical directions, and may have a better position limitation effect. As shown in FIG. 11 (a), the shapes of the first protruding portion 301 and the notch 3021 are both trapezoidal. As shown in FIG. 11 (b), the shapes of the first protruding portion 301 and the notch 3021 are both semi-elliptical. The shape of the second protruding portion 302 includes but is not limited to the rectangular protruding portion shown in the figure, and may also be other shapes. It should be noted that when the heat dissipation bars are close to each other, the first protruding portion 301 and the notch 3021 are engaged with each other, and there is also a gap between the other opposite parts of the two heat dissipation bars. Each heat dissipation bar may also be provided with a plurality of such structures. As shown in FIG. 11(c), each heat dissipation bar is provided with three first protruding portions 301 and second protruding portions 302.

Figure 12:
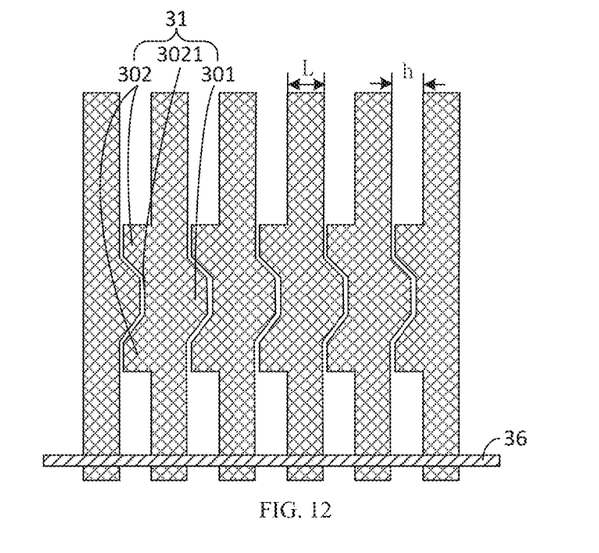
FIG. 12 is a schematic diagram of a structure of a first heat dissipation sheet including a heat dissipation pipe.

Further, in an exemplary embodiment, referring to FIG. 12, the first heat dissipation sheet 3 is further provided with a heat dissipation pipe 36, which is used to connect the heat dissipation bars 31 together to conduct the heat of the respective heat dissipation bars 31, thereby improving the uniformity of heat conduction of the entire first heat dissipation sheet 3, and making the heat distribution on the entire first heat dissipation sheet 3 more uniform.

Figure 13:
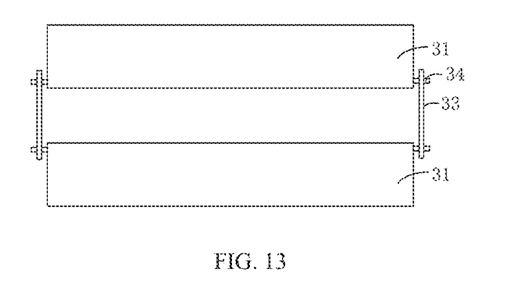
FIG. 13 is a schematic diagram of a structure in which heat dissipation bars are connected by a connection member.
Figure 14:
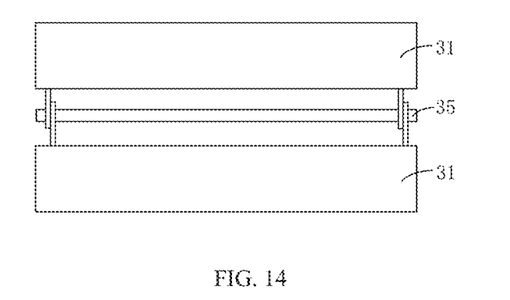
FIG. 14 is a schematic view of a structure in which heat dissipation bars are connected by another connection member.

In some other embodiments, the adjacent heat dissipation bars 31 may be connected together by a connection member 33. In order not to affect the bending of the adjacent heat dissipation bars 31, the connection member 33 and the heat dissipation bar 31 may be pivotally connected, which structure may allow two adjacent heat dissipation bars 31 to be folded relatively. Specifically, as shown in FIG. 13, the connection member 33 may be a bar-shaped rod provided at ends of two adjacent heat dissipation bars 31. The extending direction of the bar-shaped rod is perpendicular to the extending direction of the heat dissipation bar 31. Mounting holes (not shown) are provided at opposite positions of an end of the connection member 33 and an end of the heat dissipation bar 31, and a shaft 34, which is horizontally arranged, penetrates the opposite mounting holes of the heat dissipation bar 31 and the connection member 33 to form a pivot connection. The heat dissipation bar 31 and the connection member 33 can both rotate around the shaft 34, so that two adjacent heat dissipation bars can rotate relative to the connection member, and thus the two heat dissipation bars 31 can be bent. As shown in FIG. 14, the connection member 3 may also be a rotation shaft 35 arranged in parallel with the heat dissipation bar 31. The rotation shaft 35 is arranged between two adjacent heat dissipation bars 31. The end of the heat dissipation bar 31 is provided with an extension part including a mounting hole (not shown), and two ends of the rotation shaft 35 pass through the mounting holes of the heat dissipation bar 31, so that the heat dissipation bar 31 can rotate along the rotation shaft 35. Of course, the connection member 33 may also have other structures, for example, it may also be a connection wire that passes through the through holes of respective heat dissipation bars to connect the heat dissipation bars in series, which will not be listed here. In this structure, even if the interval between two adjacent heat dissipation bars 31 is small, the first heat dissipation sheet 3 can still be bent through the pivot connection structure. Since the heat dissipation bars 31 are connected as a whole by the connection member 33, the structure thereof is more stable. At the same time, the material of the connection member may be a metal or other material with a heat-conducting function, so that the heat on the heat dissipation bars 31 can be transferred to each other through the connection member, so that the heat distribution of the entire first heat dissipation sheet 3 is more uniform.

In the above embodiment, referring to FIG. 7, the width and interval of the heat dissipation bars 31 have a significant impact on the bending effect, heat dissipation effect, and support effect. If the interval is too large, the width of the heat dissipation bar 31 is too narrow, which will lead to poor heat dissipation and poor support. If the interval is too small, the width of the heat dissipation bar 31 is too wide, which may affect the bending effect. In an embodiment, the width L of the heat dissipation bar 31 satisfies 0.05 mm≤L≤20 mm. For example, L may take values of 0.05 nm, 0.1 nm, 1 nm, 2 nm, 5 nm, 10 nm, 15 nm, 20 nm. The smaller the value of L is, the more difficult it is for the heat dissipation bar 31 to form an obvious uneven structure in the longitudinal direction. The width h of the interval between two adjacent heat dissipation bars 31 satisfies 0.1 mm≤h≤10 mm. For example, h can take values of 0.1 nm, 1 nm, 2 nm, 5 nm, 8 nm, and 10 nm. Within this size range, the bending effect of the first heat dissipation sheet is smoother, the heat dissipation effect is ideal, and the structural stability and support effect is better.

It should be noted that, referring to FIG. 12, when the heat dissipation bar 31 includes the first protruding portion 301, the width L of the heat dissipation bar 31 is the width of the portion of the heat dissipation bar 31 other than the first protruding portion 301, that is, the minimum width of the heat dissipation bar 31. The width h of the interval between two adjacent heat dissipation bars 31 is the distance between the parts of the two heat dissipation bars 31 other than the first protruding portions 301, that is, the maximum distance between two adjacent heat dissipation bars 31. The size of the first protruding portion 301 may be set according to the structure and the distance between the heat dissipation bars 31.

Figure 15:
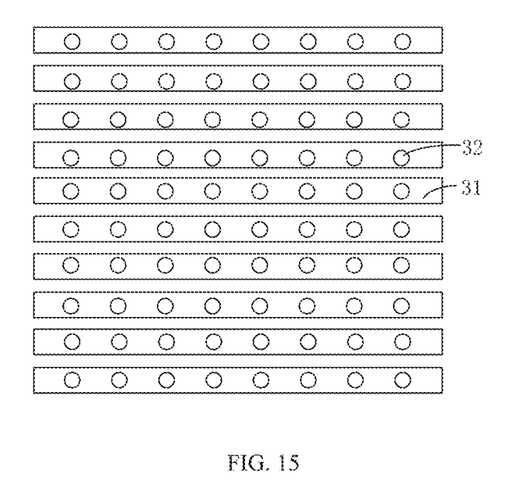
FIG. 15 is a schematic diagram of a structure in which through holes are formed in a heat dissipation bar.

Further, in an exemplary embodiment, referring to FIG. 15, the heat dissipation bar 31 is also provided with a through hole 32. The through hole 32 makes the heat dissipation bar 31 bendable, thereby further improving the bendable performance of the first heat dissipation sheet.

In the present disclosure, regardless of whether the first heat dissipation sheet adopts a sheet-like structure or a structure with the heat dissipation bars 31, the thickness of the first heat dissipation sheet may be no more than 1 mm. Such thickness may meet the heat dissipation requirements, and at the same time, the thickness of the entire device is not significantly increased, which is conducive to achieving a lighter and thinner configuration.

Figure 16:
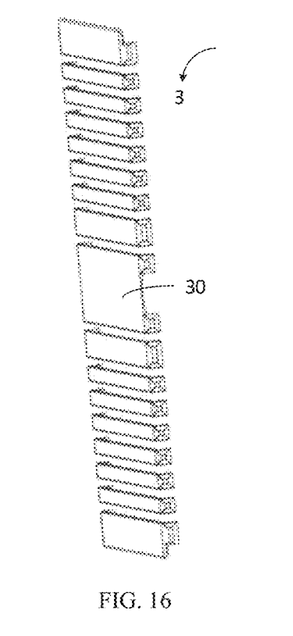
FIG. 16 is a schematic diagram of a structure in which a non-bending area is provided on a first heat dissipation sheet.

It should also be noted that, as shown in FIG. 16, the first heat dissipation sheet 3 may include a non-bending area 30, and the non-bending area 30 may be a whole non-bendable structural layer. For example, the area of the first heat dissipation sheet 3 corresponding to the non-bendable motherboard IC of the display panel may be set as a whole metal layer, and the other bendable area is a heat dissipation sheet structure.

The structure of the first heat dissipation sheet 3 in the heat dissipation assembly shown in FIG. 3 has been described in detail above. In another embodiment, the first heat dissipation sheet 3 may also be arranged on the side of the flexible battery 2 facing away from the flexible display panel 1 to absorb heat emitted from the side of the flexible battery 2 facing away from the display panel 1, which can also reduce the temperature of the battery 2 to prevent the local temperature of the battery 2 from being too high.

Figure 17:
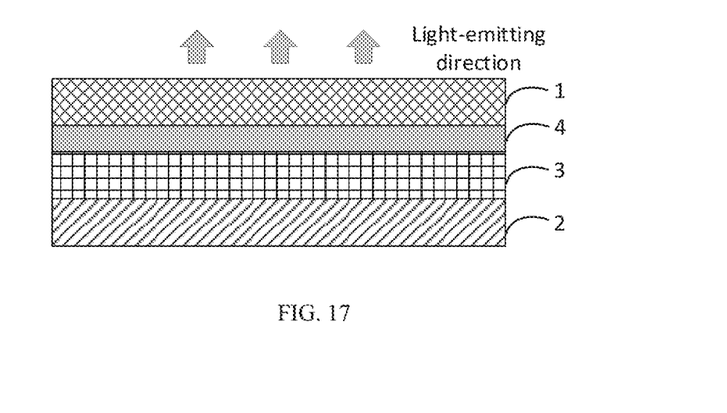
FIG. 17 is a schematic diagram of a structure of a heat dissipation assembly in a second embodiment.

In an embodiment, as shown in FIG. 17, on the basis of FIG. 3, the heat dissipation assembly further includes a heat insulation layer 4, and the first heat dissipation sheet 3 and the heat insulation layer 4 are both provided between the flexible display panel 1 and the flexible battery 2. The heat insulation layer 4 is located between the first heat dissipation sheet 3 and the flexible display panel 1. The heat insulation layer 4 is in the shape of sheet as a whole, and also has a bendable area.

The function of the heat insulation layer 4 is to isolate the heat between the first heat dissipation sheet 3 and the flexible display panel 1 to shield the thermal effect of the high temperature of the first heat dissipation sheet 3 on the flexible display panel 1. Therefore, the heat insulation layer 4 may be made of materials with lower thermal conductivity, for example, organic materials such as rubber. At the same time, the heat insulation layer 4 may also have a bendable area so that it may also be bent or folded to match the overall structure of the display device. It can be understood that the bendable area of the heat insulation layer 4 may correspond to the bendable area of the first heat dissipation sheet 3, the flexible display panel 1 or the flexible battery 2. Then, a structure of a patterned opening hole 10 may also be provided on the heat insulation layer 4, or a material with higher flexibility may be selected. On the other hand, the heat insulation layer 4 may further use an insulating material to prevent the current leaked from the battery 2 from being conducted to the display panel 1 via the first heat dissipation sheet 3 and affecting the display panel 1.

Therefore, in view of the above requirements, the material of the heat insulation layer 4 may be rubber, silica gel, polyurethane, acrylic or porous materials such as foam materials, fiber materials. The hollow structure of the porous materials may be filled with air or other media. The material of the heat insulation layer 4 may also be heat-reflective materials, such as gold-plated, silver-plated polyimide film.

The heat insulation layer 4 may be fixed to the first heat dissipation sheet 3 or the display panel 1 through a mechanical connection method or an adhesive method.

Figure 18:
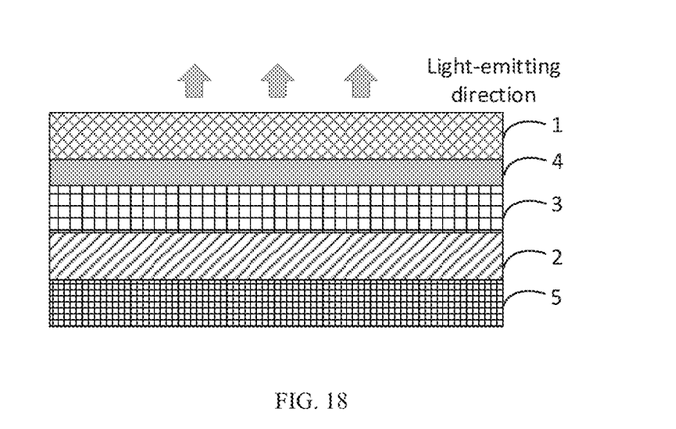
FIG. 18 is a schematic diagram of a structure of a heat dissipation assembly in a third embodiment.

In an embodiment, as shown in FIG. 18, on the basis of FIG. 3, the heat dissipation assembly further includes a second heat dissipation sheet 5. Specifically, the first heat dissipation sheet 3 and the heat insulation layer 4 are both provided between the flexible display panel 1 and the flexible battery 2, the heat insulation layer 4 is arranged between the first heat dissipation sheet 3 and the flexible display panel 1, and the second heat dissipation sheet 5 is arranged on the side of the flexible battery 2 away from the flexible display panel 1, and have a sheet shape as a whole to cover the side of the flexible batter 2 to absorb the heat emitted by the side of the flexible battery 2 away from the display panel 1, so that the entire device has a more ideal heat dissipation performance. The second heat dissipation sheet 5 has a bendable area. It can be understood that the bendable area of the second heat dissipation sheet 5 corresponds to the bendable areas of the first heat dissipation sheet 3, the heat insulation layer 4, the flexible battery 2, and the flexible display panel 1. In other embodiments, when the first heat dissipation sheet 3 is arranged on the side of the flexible battery 2 away from the flexible display panel 1, the second heat dissipation sheet 5 is arranged on the side of the flexible battery 2 facing the flexible display panel 1, that is, between the flexible battery 2 and the flexible display panel 1. At this time, the heat insulation layer may be arranged between the second heat dissipation sheet 5 and the flexible display panel 1 to block the influence of the high temperature of the second heat dissipation sheet 5 on the flexible display panel 1. In other words, the heat insulation layer may always be arranged between the heat dissipation sheet close to the flexible display panel and the flexible display panel.

The structure of the second heat dissipation sheet 5 may be the same as or different from that of the first heat dissipation sheet 3. The material of the second heat dissipation sheet 5 may be the same as or different from that of the first heat dissipation sheet 3. For example, the first heat dissipation sheet adopts the metal heat dissipation bar structure shown in FIG. 9, and the second heat dissipation sheet adopts a one-piece graphene film layer; or, the first heat dissipation sheet adopts the metal patterned through hole structure shown in FIG. 6, and the second heat dissipation sheet adopts the metal heat dissipation bar structure shown in FIG. 9.

The fixing method of the second heat dissipation sheet 5 and the flexible battery 2 may refer to that of the first heat dissipation sheet 3, and the structure of the bendable area of the second heat dissipation sheet 5 may also refer to that of the first heat dissipation sheet 3, which will not be repeated here. In addition, the parameters such as the thickness and size of the second heat dissipation sheet 5 may also be the same as or different from those of the first heat dissipation sheet 3.

Figure 19:
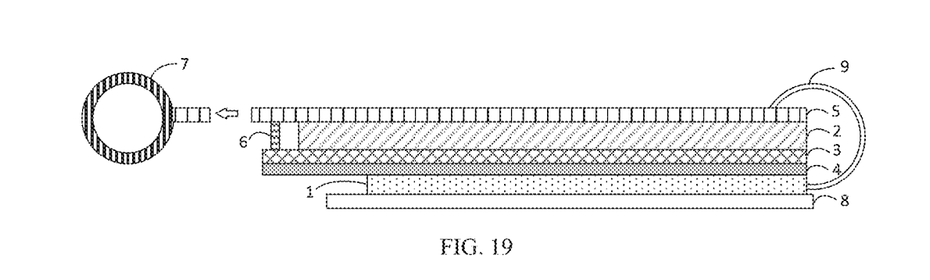
FIG. 19 is a schematic diagram of a structure of a heat dissipation assembly in a fourth embodiment.

FIG. 19 shows another structure of the heat dissipation assembly in an embodiment, and the structure includes a first heat dissipation sheet 3, a heat insulation layer 4, a second heat dissipation sheet 5, and a heat conduction member 6. The first heat dissipation sheet 3 and the heat insulation layer 4 are both provided between the flexible display panel 1 and the flexible battery 2, the heat insulation layer 4 is arranged between the first heat dissipation sheet 3 and the flexible display panel 1, the second heat dissipation sheet 5 is arranged on the side of the flexible battery 2 away from the flexible display panel 1, the heat conduction member 6 is arranged between the first heat dissipation sheet 3 and the second heat dissipation sheet 5 and connects the first heat dissipation sheet 3 and the second heat dissipation sheet 5, the heat conduction member 6 is positioned on at least one side of the flexible battery 2 and is spaced apart from the flexible battery 2.

The heat conduction member 6 is used to absorb the heat on the first heat dissipation sheet 3 and the second heat dissipation sheet 5. Since the heat conduction member 6 is not in contact with the flexible battery 2, it further conducts the heat on the first heat dissipation sheet 3 and the second heat dissipation sheet 5 to the heat conduction member 6 to further reduce the heat of the battery 2. The heat conduction member 6 may be a metal material, or an organic material with high heat conduction efficiency such as graphene.

The heat conduction member 6 may be a columnar structure arranged between the first heat dissipation sheet 3 and the second heat dissipation sheet 5, or may also be a sheet-like structure, of course, it may also be of other forms, which is not specifically limited in the present disclosure.

The heat conduction member 6 may be arranged on only one side of the battery 2, or on more sides of the battery 2. The heat conduction member 6 may be an integral structure with the first heat dissipation sheet 3 or the second heat dissipation sheet 5. When the first heat dissipation sheet 3 or the second heat dissipation sheet 5 includes a heat dissipation bar 31 and a heat dissipation pipe 36, the heat conduction member 6 may also be connected to the heat dissipation pipe 36 to conduct heat away.

In an exemplary embodiment, with continued reference to FIG. 19, the display device further includes a heat dissipation unit 7, and the heat dissipation unit 7 is connected to at least one of the above first heat dissipation sheet, second heat dissipation sheet or heat conduction member for absorbing the heat of the heat dissipation assembly and conducting the heat to the outside of the display device. The heat dissipation unit 7 is disposed in the housing of the display device, and is used to conduct the absorbed heat to the outside of the housing, and may include structures such as cooling fins and fans. In order to be connected to the heat dissipation unit 7, at least one of the first heat dissipation sheet 3, the second heat dissipation sheet 5, and the heat conduction member 6 may extend to the heat dissipation unit 7. Taking that shown in the figure as an example, the heat dissipation unit 7 is provided on a side of the flexible battery 2, and the first dissipation sheet 3 extends outward along said side relative to the second dissipation sheet 5 until being connected to the radiating unit 7. The leftward arrow in the figure indicates the omitted extension. In other embodiments, it may also be the second heat dissipation sheet 5 or the heat conduction member 6 that extends toward the heat dissipation unit 7, which is not specifically limited in the present disclosure.

FIG. 19 also shows a cover plate 8 covering a light-emitting side of the display panel 1 and a flexible circuit board 9 connected to the display panel 1 in the display device. Of course, the display device also includes other parts such as a driver IC and a housing, which is not listed one by one herein. It should be noted that in the embodiment, the size of the flexible battery 2 is larger than that of the flexible display panel 1. In other embodiments, the size of the flexible battery 2 may also be equal to or smaller than the flexible display panel 1.

It should be noted that the present disclosure does not specifically limit the application of the display device, which may be any product or part with display function such as televisions, laptops, tablets, wearable display devices, mobile phones, car displays, navigation, e-books, digital photo frames, advertising light boxes.

Although relative terms such as "upper" and "lower" are used in the specification to describe the relative relationship between one component and another component shown, these terms are used in the specification only for convenience of description, for example, according to the example direction shown in the figures. It can be understood that if a device shown is turned over, a component described as "upper" will become the "lower" component. When a structure is "on" another structure, it may mean that the structure is integrally formed on said another structure, or that the structure is "directly" installed on said another structure, or that the structure is "indirectly" installed on said another structure through other structure.

The terms "a", "an", "the", "said", and "at least one" are used to indicate the presence of one or more elements/components/etc.; and the terms "include" and "have" are used to indicate an open-ended inclusive means and means that there may be additional elements/components/etc. in addition to the listed elements/components/etc.

Those skilled in the art may easily conceive of other embodiments of the present disclosure after considering the specification and practicing the invention disclosed herein. The present application is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and embodiments are only regarded as exemplary, and the true scope and spirit of the present disclosure are pointed out by the appended claims.

What is claimed is:

1. A flexible display device, comprising:
   a flexible display panel;
   a flexible battery arranged at a side of the flexible display panel away from a light emitting surface; and
   a heat dissipation assembly comprising a first heat dissipation sheet, the first heat dissipation sheet being arranged at a side of the flexible battery facing toward or away from the flexible display panel, and the first heat dissipation sheet having a bendable area,
   wherein the bendable area of the first heat dissipation sheet has a through structure in a thickness direction, and
   wherein the first heat dissipation sheet comprises a plurality of heat dissipation bars arranged in parallel in the bendable area, any two adjacent heat dissipation bars have an interval therebetween, and the interval forms the through structure.

2. The flexible display device according to claim 1, wherein:
   the first heat dissipation sheet further comprises a plurality of connection members, and each of the plurality of connection members connects two adjacent heat dissipation bars, and
   each of the plurality of connection members is pivotally connected to the two adjacent heat dissipation bars, so that the two adjacent heat dissipation bars are rotatable relative to the connection member.

3. The flexible display device according to claim 1, wherein at least one first protruding portion is provided on at least one long side of each of the plurality of heat dissipation bars and faces an adjacent heat dissipation bar.

4. The flexible display device according to claim 3, wherein a second protruding portion is provided on a long side of a heat dissipation bar at a position corresponding to a first protruding portion of an adjacent heat dissipation bar, the second protruding portion has a notch that matches a shape of the first protruding portion, and the notch and the first protruding portion are configured to be fit to each other.

5. The flexible display device according to claim 1, wherein the first heat dissipation sheet further comprises a heat dissipation pipe, and the heat dissipation pipe is connected to each of the plurality of heat dissipation bars.

6. The flexible display device according to claim 1, wherein the first heat dissipation sheet further comprises a base layer, the plurality of heat dissipation bars are adhered to one side of the base layer, and another side of the base layer is bonded to the flexible battery or the flexible display panel.

7. The flexible display device according to claim 1, wherein a width L of each of the plurality of heat dissipation bars satisfies 0.05 mm≤L≤20 mm, and a width h of the interval between two adjacent heat dissipation bars satisfies 0.1 mm≤h≤10 mm.

8. The flexible display device according to claim 1, wherein a through hole is formed in each of the plurality of heat dissipation bars.

9. The flexible display device according to claim 1, wherein a material of the first heat dissipation sheet is metal.

10. The flexible display device according to claim 1, wherein the heat dissipation assembly further comprises:
a second heat dissipation sheet arranged on another side of the flexible battery facing toward or away from the flexible display panel, the second heat dissipation sheet having a bendable area, and the bending area of the second heat dissipation sheet corresponding to the bendable area of the first heat dissipation sheet.

11. The flexible display device according to claim 10, wherein a structure of the second heat dissipation sheet is same as or different from that of the first heat dissipation sheet, and a material of the second heat dissipation sheet is same as or different from that of the first heat dissipation sheet.

12. The flexible display device according to claim 10, wherein the heat dissipation assembly further comprises:
a heat insulation layer arranged between one of the first heat dissipation sheet and the second heat dissipation sheet close to the flexible display panel and the flexible display panel, and having a bendable area corresponding to the bendable area of the first heat dissipation sheet.

13. The flexible display device according to claim 12, wherein the heat insulation layer comprises a material of rubber, silica gel, porous material, polyurethane, acrylic, or an organic film layer containing a metal coating.

14. The flexible display device according to claim 12, wherein thicknesses of the first heat dissipation sheet, the heat insulation layer and the second heat dissipation sheet are not larger than 1 mm.

15. The flexible display device according to claim 12, wherein the heat dissipation assembly further comprises:
a heat conduction member arranged between the first heat dissipation sheet and the second heat dissipation sheet and connecting the first heat dissipation sheet and the second heat dissipation sheet, the heat conduction member being located on at least one side of the flexible battery and there being an interval between the heat conduction member and the flexible battery.

16. The flexible display device according to claim 15, wherein the flexible display device further comprises: a heat dissipation unit connected to at least one of the first heat dissipation sheet, the second heat dissipation sheet or the heat conduction member.

17. The flexible display device according to claim 1, wherein;
the flexible battery comprises a flexible housing and a positive electrode, a negative electrode, an electrolyte, a separator, a positive current collector, and a negative current collector arranged in the flexible housing,
the positive electrode and the negative electrode are arranged opposite to each other,
the separator is arranged between the positive electrode and the negative electrode,
the positive current collector is arranged on a side of the positive electrode away from the insulation layer,
the negative current collector is arranged on a side of the negative electrode away from the insulation layer, and
the electrolyte is distributed between the positive electrode and the negative electrode.

\* \* \* \* \*